(12) United States Patent
Chen

(10) Patent No.: US 11,610,948 B2
(45) Date of Patent: Mar. 21, 2023

(54) OLED WITH BUTTERFLY-SHAPED SPACER

(71) Applicant: WUHAN CHINA STAR OPTOELECTRONICS SEMICONDUCTOR DISPLAY TECHNOLOGY CO., LTD., Hubei (CN)

(72) Inventor: Pan Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 76 days.

(21) Appl. No.: 16/980,159

(22) PCT Filed: Jul. 30, 2020

(86) PCT No.: PCT/CN2020/105737
§ 371 (c)(1),
(2) Date: Sep. 11, 2020

(87) PCT Pub. No.: WO2022/007058
PCT Pub. Date: Jan. 13, 2022

(65) Prior Publication Data
US 2022/0013602 A1    Jan. 13, 2022

(30) Foreign Application Priority Data
Jul. 7, 2020    (CN) .......................... 202010647489.7

(51) Int. Cl.
*H01L 27/32*    (2006.01)

(52) U.S. Cl.
CPC ...... *H01L 27/3246* (2013.01); *H01L 27/3218* (2013.01)

(58) Field of Classification Search
CPC .................... H01L 27/3246; H01L 27/3218
See application file for complete search history.

(56) References Cited

U.S. PATENT DOCUMENTS 8,994,015 B2    3/2015  Pyon et al.
2011/0221334 A1*  9/2011  Kwon ................ H01L 27/3246
                                                       313/504
(Continued)

FOREIGN PATENT DOCUMENTS

CN    106910841 A    6/2017
CN    108807478 A    11/2018
(Continued)

*Primary Examiner* — Peter Bradford
(74) *Attorney, Agent, or Firm* — PV IP PC; Wei Te Chung; Ude Lu

(57) ABSTRACT

The present application proposes a display panel, including a display area and a non-display area surrounding the display area, wherein the display panel includes: a plurality of metal traces and a plurality of color resist blocks located in the display area; and a test key located in the non-display area, wherein the test key includes a plurality of color resist patterns and a plurality of metal patterns, each of the color resist patterns corresponds to a corresponding one of the color resist blocks, each of the metal patterns corresponds to one of the metal traces, and each of the color resist patterns is disposed correspondingly between adjacent ones of the metal patterns.

8 Claims, 2 Drawing Sheets

(56) References Cited

U.S. PATENT DOCUMENTS

| 2014/0252321 | A1* | 9/2014 | Pyon | H01L 27/3246 |
| | | | | 257/89 |
| 2017/0025611 | A1* | 1/2017 | Huang | H01L 51/0011 |
| 2021/0013434 | A1* | 1/2021 | Cao | H01L 51/0097 |

FOREIGN PATENT DOCUMENTS

| CN | 109004010 A | 12/2018 |
| CN | 109065574 A | 12/2018 |
| CN | 109148714 A | 1/2019 |
| CN | 109560116 A | 4/2019 |
| JP | 2015082411 A | 4/2015 |

\* cited by examiner

OLED WITH BUTTERFLY-SHAPED SPACER

BACKGROUND OF INVENTION

Field of Invention

The present application relates to a display field, and in particular to a display panel and a display device.

Description of Prior Art

Currently, photo spacers (PS) are widely used in the display device industry, and their cross-sections are all rectangular.

In processes, such as exposure, evaporation, and so on, an attraction force on a magnetic plate or a mechanism design will be closely attached to a mask or other fixtures to perform further production.

As shown in FIG. 1, usually a mask 94 will sag to a certain degree under influence of gravity. Due to the support of a spacer 93, a layer 92 on a substrate 91 under the mask 94 or other portions protected by the spacer will not be in contact with the mask 94, so a yield rate of the process is guaranteed.

As shown in FIG. 2, because the attraction of the magnetic plate or the mechanism design will be closely attached to a mask 94 or other fixtures, the spacer 93 may be in direct physical contact with the mask 94, causing the spacer 93 to be crushed and lose its support and protection functions, such that the layer 92 on the substrate 91 under the mask 93 or other portions protected by the spacer 93 are scratched, resulting in damage to the film 92 and yield loss.

SUMMARY OF INVENTION

The present application provides a display panel and a display device, which can solve the technical problem that during processes of exposure, evaporation, etc., a spacer may be in direct physical contact with a mask, causing the spacer to be crushed, so that the mask may scratch a layer on a substrate below the mask or portions protected by the spacer, and thus the layer is damaged, resulting in produce defects and yield loss.

An embodiment of the present application provides a display panel, including a substrate; a driving circuit layer disposed on the substrate; a pixel definition layer disposed on the driving circuit layer, and including a plurality of pixel definition units arranged at intervals and a plurality of sub-pixel grooves located between the plurality of pixel definition units; and a support layer disposed on the pixel definition layer and including a plurality of spacers arranged on the pixel definition unit at intervals, wherein the spacers are disposed between adjacent ones of the sub-pixel grooves, and the spacers are formed of a plurality of sub-supporting columns, which are configured to increase their cross-sectional areas and compressive strength, and support the mask thereon during a manufacturing process to ensure uniform stress release.

Further, each of the plurality of sub-pixel grooves has a symmetry axis positioned on a first straight line and vertexes arranged opposite to each other, and each of the spacers has a center point positioned on the first straight line.

Further, a cross-section of each of the sub-supporting columns has a shape including one or more of a polygon, a circle, or an oval.

Further, each of the spacers includes: a central body arranged between vertexes of adjacent ones of the sub-pixel grooves; a first butterfly-shaped wing arranged corresponding to one of the vertexes of the sub-pixel grooves, and having a middle part connected to the central body; and a second butterfly-shaped wing arranged corresponding to another one of the vertexes of the sub-pixel grooves, and having a middle part connected to the central body, wherein the first butterfly-shaped wing and the second butterfly-shaped wing are arranged in a pair on opposite sides of the central body, and an edge of each of the first butterfly-shaped wing and the second butterfly-shaped wing extends alongside an edge of one of the sub-pixel grooves.

Further, the central body has a polygonal cross-section, each of the first butterfly-shaped wing and the second butterfly-shaped wing is formed of one or more of the sub-supporting columns connected to each other, and each of the sub-supporting columns has a circle cross-section or an oval cross-section.

Further, the first butterfly-shaped wing, the second butterfly-shaped wing, and the central body are integrally disposed.

Further, each of the spacers has a cross-section of an axially symmetric shape and a symmetry axis parallel or perpendicular to the first straight line.

Further, all of the spacers have a same height.

Further, a center width of each of the spacers between adjacent ones of the sub-pixel grooves is smaller than a minimum distance between adjacent ones of the sub-pixel grooves, and a width of two edges of each of the spacers is greater than the minimum distance between adjacent ones of the sub-pixel grooves.

An embodiment of the present application also provides a display device, which includes any of the above-mentioned display panels.

Beneficial effects of the present invention are that, in order to reduce a risk of yield reduction caused by the spacer being crushed, a display panel and a display device are provided, wherein by using a profiled spacer with an increased cross-sectional area and a width set within a safe range, that is, the spacer is formed of a plurality of sub-supporting columns, and with a cross-section which is preferably butterfly-shaped, to increase its cross-section area and compressive strength to achieve better support and protection capabilities. The spacer is used in a manufacturing process to support the mask set above it to ensure uniform stress release, thereby reducing the risk of spacers being crushed, avoiding film damage which causes defects, such that a purpose of improving the yield is achieved, and a better application in the display device is realized.

Figure 1:
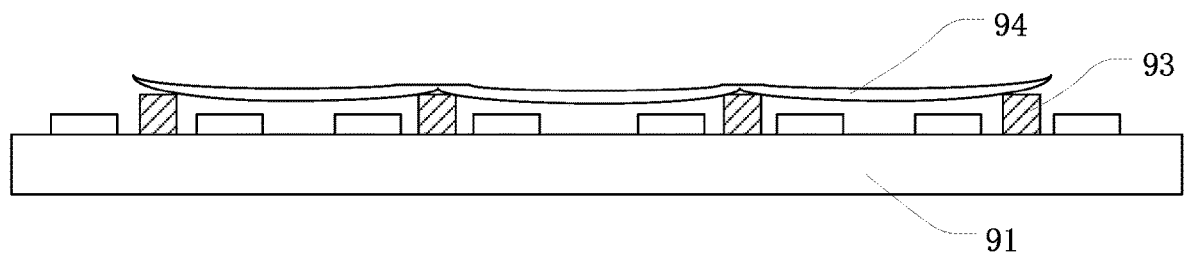
FIG. 1 is a schematic structural diagram of a mask normally supported by a spacer in the prior art.
Figure 2:
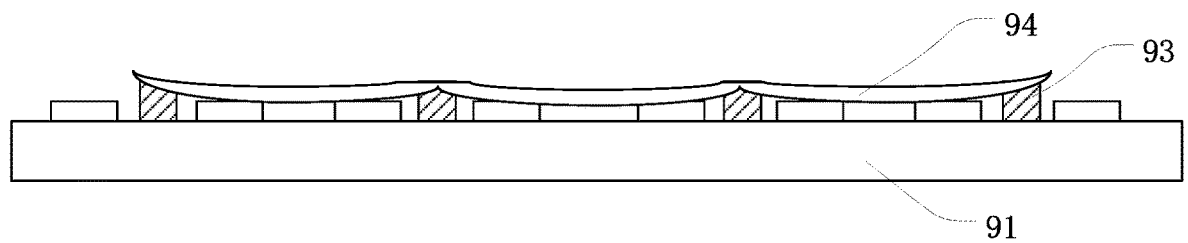
FIG. 2 is a schematic structural diagram of a spacer being crushed by a mask in the prior art.

Elements in the drawings are designated by reference numerals listed below:
1. substrate, 2. driving circuit layer, 3. pixel definition layer,
4. support layer, 11. flexible substrate layer, 12. barrier layer,
13. buffer layer, 20. thin film transistor unit, 21. active layer,
22. first gate insulating layer, 23. first gate layer,
24. second gate insulating layer, 25. second gate layer,
26. interlayer insulation, 27. source/drain layer, 28. planarization layer, 29. anode layer, 30. first straight line, 31. pixel definition unit, 32. sub-pixel groove, 40. spacer, 41. central body, 42, first butterfly wing, 43, second butterfly wing,
100, display panel, 200, mask.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

Figure 3:
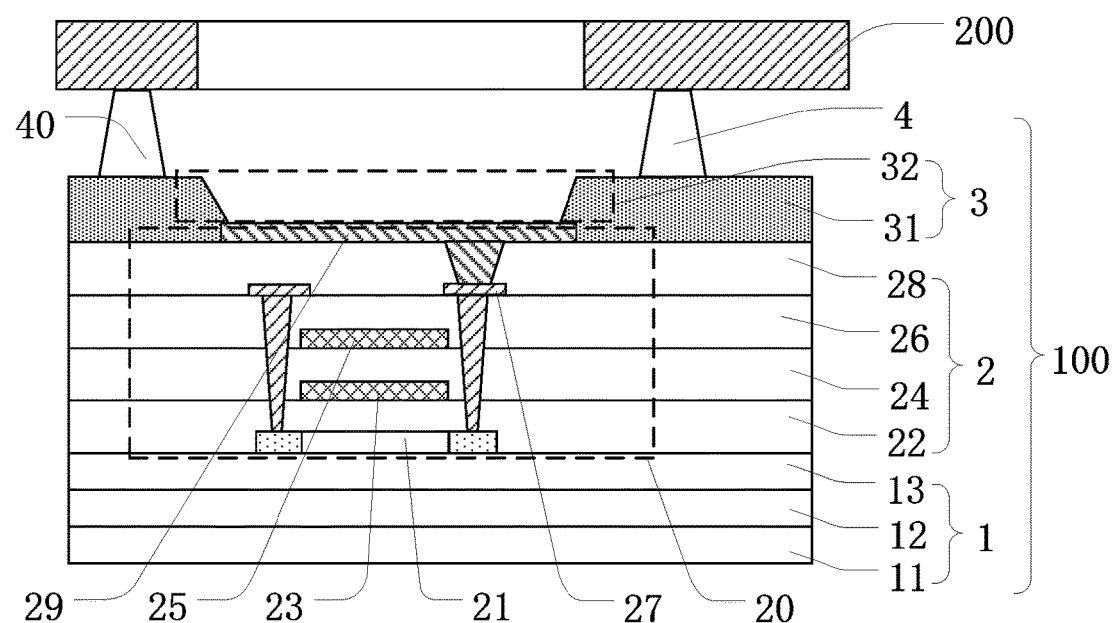
FIG. 3 is a schematic structural diagram of a mask supported by a support layer of a display panel according to an embodiment of the application.
Figure 4:
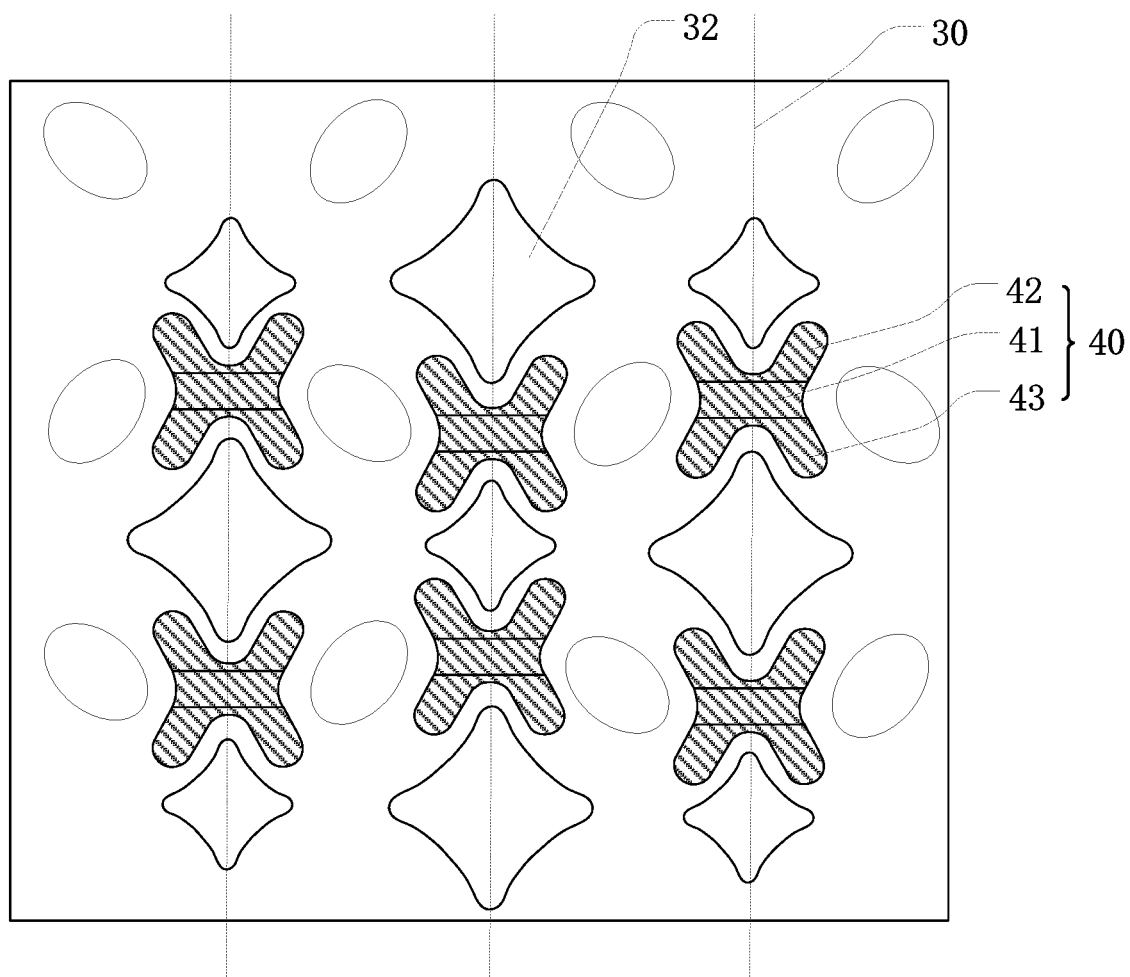
FIG. 4 is a partial enlarged top view of a support layer in FIG. 3.

Specifically, referring to FIGS. 3 and 4, an embodiment of the present application provides a display panel 100, which includes a substrate 1, a driving circuit layer 2, a pixel definition layer 3, and a support layer 4. The driving circuit layer 2 is disposed on the substrate 1; the pixel definition layer 3 is disposed on the driving circuit layer 2, and includes a plurality of pixel definition units 31 arranged at intervals and a plurality of sub-pixel grooves 32 located between the plurality of pixel definition units 31, wherein the sub-pixel grooves 32 are configured to accommodate or correspondingly arrange sub-pixel units, and for an organic light-emitting diode, the light-emitting layer is arranged in the sub-pixel grooves 32; the support layer 4 is arranged in the pixel definition layer 3 and includes a plurality of spacers 40 (photo spacer, PS); the spacers 40 are also called supporting columns or separating columns, which mainly play a supporting role; the spacers 40 are arranged on the pixel definition unit 31 at intervals, and the spacers 40 are arranged on between adjacent ones of the sub-pixel grooves 32, wherein each of the spacers 40 is composed of a plurality of sub-supporting columns, a cross-section of each of the sub-supporting columns has a shape including one or more of a polygon, a circle, or an oval, preferably, the cross-section of each of the spacers 40 is butterfly-shaped so as to increase its cross-section area and compressive strength, and the spacers 40 are configured to support the mask 200 arranged there above during the manufacturing process to ensure uniform stress release.

The mask 200 used has an opening pattern corresponding to the sub-pixel grooves 32, and after the mask 200 is set during the manufacturing process, processes such as coating, exposure, development, etching, peeling, and so on, can be performed in sequence to complete the process making the mask 200 supported by the spacer 40.

In this embodiment, by using a profiled spacer 40 with an increased cross-sectional area and a width set within a safe range, that is, the spacer 40 has a butterfly-shaped cross-section. Compared the spacer 40 with a rectangular cross-section in the prior art, the spacer 40 has a butterfly-shaped cross-section in the present application increase the cross-section area and compressive strength to achieve better support and protection capabilities. The spacer is used in a manufacturing process to support the mask 200 set above it to ensure uniform stress release, thereby reducing the risk of spacers 40 being crushed by the mask 200, avoiding film damage which causes defects, such that a purpose of improving the yield is achieved, and a better application in the display device is realized.

As shown in FIG. 4, in this embodiment, each of the sub-pixel grooves 32 are preferably set to have a diamond shape, and has a symmetry axis positioned on a first straight line 30 and vertexes arranged opposite to each other. Each of the spacers 40 has a center point also positioned on the first straight line 30. In FIG. 4, it can be understood that the first straight line 30 is arranged longitudinally, which is the symmetry axis of the sub-pixel groove 32 and the spacers 40.

In this embodiment, each of the spacers 40 includes a central body 41, a first a butterfly-shaped wing 42, and a second butterfly-shaped wing 43, wherein the central body 41 is arranged between vertexes of adjacent ones of the sub-pixel grooves 32; the first butterfly-shaped wing 42 is arranged corresponding to one of the vertexes of the sub-pixel grooves 32, and has a middle part connected to the central body 41; and the second butterfly-shaped wing 43 is arranged corresponding to another one of the vertexes of the sub-pixel grooves 32, and has a middle part connected to the central body 41; wherein the first butterfly-shaped wing 42 and the second butterfly-shaped wing 43 are arranged in a pair on opposite sides of the central body 41, and an edge of each of the first butterfly-shaped wing 42 and the second butterfly-shaped wing 43 extends alongside an edge of one of the sub-pixel grooves 32.

In this embodiment, the central body 41 has a polygonal cross-section, preferably a rectangular cross-section; ach of the first butterfly-shaped wing 42 and the second butterfly-shaped wing 43 is formed of one or more of the sub-supporting columns connected to each other, and each of the sub-supporting columns has a circle cross-section or an oval cross-section.

The first butterfly-shaped wing 42 and the second butterfly-shaped wing 43 can be mirror graphics or asymmetrical graphics.

For example, the first butterfly-shaped wing 42 and the second butterfly-shaped wing 43 are asymmetrical graphics.

The first butterfly-shaped wing 42 is one of the supporting columns with a circular cross-section, and the second butterfly-shaped wing 43 is formed by a plurality of sub-supporting columns connected to each other and each having a circular or oval cross-section, such that the first butterfly-shaped wing 42 and the second butterfly-shaped wing 43 are asymmetrical figures, wherein the symmetry axis of the spacer 40 and the first straight line intersects each other at an included angle which is preferably 45 degrees. In the entire mask 200, the symmetry axes of all the spacers 40 may or may not be arranged parallel to each other, as long as the effect of increasing the cross-section area and compressive strength is satisfied, which all belongs to the protection scope of the present invention.

Alternatively, the first butterfly-shaped wing 42 and the second butterfly-shaped wing 43 can be mirror images, and each of the first butterfly-shaped wing 42 and the second butterfly-shaped wing 43 is formed of one or more of the sub-supporting columns 32 connected to each other, and each of the sub-supporting columns 32 has a circle cross-section or an oval cross-section, such that the cross-section of the spacer is an axisymmetric graphic, and the symmetry axis of the spacer is parallel or vertical to the first straight line. Preferably, the cross-sections of the first butterfly wing 42 and the second butterfly wing 43 are both V-shaped, so that the first butterfly wing 42 and the second butterfly wing 43 are arranged in pairs on opposite sides of the central body 41 in an X-like shape, so that the cross-section of the spacer 40 is butterfly-shaped.

In this embodiment, the first butterfly-shaped wing 42, the second butterfly-shaped wing 43, and the central body 41 are integrally formed.

In this embodiment, all the spacers 40 have the same height, so as to support the mask 200 disposed above it during the manufacturing process to ensure uniform stress release.

In this embodiment, a center width of each of the spacers 40 between adjacent ones of the sub-pixel grooves 32 is smaller than a minimum distance between adjacent ones of the sub-pixel grooves 32, and a width of two edges of each of the spacers 40 is greater than the minimum distance between adjacent ones of the sub-pixel grooves 32.

As shown in FIG. 3, in this embodiment, the driving circuit layer 2 is provided with at least one thin film transistor unit 20, and the thin film transistor unit 20 is provided corresponding to the sub-pixel groove 32.

More specifically, the substrate 1 includes a flexible base layer 11, a barrier layer 12, and a buffer layer 13 that are sequentially stacked from bottom to top. A material of the flexible base layer 11 includes polyimide (PI), which plays a role of bending stress buffer. The driving circuit layer 2 includes an active layer 21, a first gate insulating layer 22, a first gate layer 23, a second gate insulating layer 24, a second gate layer 25, and a interlayer insulating layer (ILD) 26, a source/drain layer 27, a planarization layer (PLN) 28, and an anode layer 29, which constitute the thin film transistor unit 20. The pixel definition layer 3 is disposed on the driving circuit layer 2, and the sub-pixel grooves 32 of the pixel definition layer 3 expose an upper surface of the anode layer 29.

Based on the same inventive concept, another embodiment of the present disclosure provides a display device including the display panel 100 provided by the above embodiments. The display device in the embodiment of the present disclosure may be any product or component with a display function, such as a mobile phone, a tablet computer, a television, a monitor, a notebook computer, a digital photo frame, a navigator, and the like.

The working principle of the display device provided in this embodiment is consistent with the working principle of the foregoing embodiments of the display panel 100. Specific structural relationships and working principles can be referred to the foregoing embodiments providing the display panel 100, which will not be repeated herein for brevity.

Beneficial effects of the present invention are that, in order to reduce a risk of yield reduction caused by the spacer being crushed, a display panel and a display device are provided, wherein by using a profiled spacer with an increased cross-sectional area and a width set within a safe range, that is, the spacer is formed of a plurality of sub-supporting columns, and with a cross-section which is preferably butterfly-shaped, to increase its cross-section area and compressive strength to achieve better support and protection capabilities. The spacer is used in a manufacturing process to support the mask set above it to ensure uniform stress release, thereby reducing the risk of spacers being crushed, avoiding film damage which causes defects, such that a purpose of improving the yield is achieved, and a better application in the display device is realized.

In the above embodiments, the descriptions of each embodiment have their own emphasis. The parts that are not described in detail in an embodiment can be referred to the detailed descriptions in other embodiments above, which will not be repeated herein for brevity.

The display panel and display device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, which comprises:
  a substrate;
  a driving circuit layer disposed on the substrate;
  a pixel definition layer disposed on the driving circuit layer, and comprising a plurality of pixel definition units arranged at intervals and a plurality of sub-pixel grooves located between the plurality of pixel definition units; and
  a support layer disposed on the pixel definition layer and comprising a plurality of spacers arranged on the pixel definition unit at intervals, wherein the spacers are disposed between adjacent sub-pixel grooves, and the spacers are formed of a plurality of sub-supporting columns;
  wherein each of the spacers comprises:
    a central body arranged between vertexes of adjacent sub-pixel grooves;
    a first butterfly-shaped wing arranged corresponding to one of the vertexes of the sub-pixel grooves, and having a middle part connected to the central body; and a second butterfly-shaped wing arranged corresponding to another one of the vertexes of the sub-pixel grooves, and having a middle part connected to the central body;

wherein the first butterfly-shaped wing and the second butterfly-shaped wing are arranged in a pair on opposite sides of the central body, and an edge of each of the first butterfly-shaped wing and the second butterfly-shaped wing extends alongside an edge of one of the sub-pixel grooves; and wherein the central body has a polygonal cross-section, each of the first butterfly-shaped wing and the second butterfly-shaped wing is formed of one or more of the sub-supporting columns connected to each other, and each of the sub-supporting columns has a bulbous portion.

2. The display panel of claim 1, wherein each of the plurality of sub-pixel grooves has a symmetry axis positioned on a first straight line and vertexes arranged opposite to each other, and each of the spacers has a center point positioned on the first straight line.

3. The display panel of claim 1, wherein a cross-section of each of the sub-supporting columns has a shape comprising one or more of a polygon, a circle, or an oval.

4. The display panel of claim 1, wherein the first butterfly-shaped wing, the second butterfly-shaped wing, and the central body are integrally disposed.

5. The display panel of claim 1, wherein each of the spacers has a cross-section of an axially symmetric shape and a symmetry axis parallel or perpendicular to the first straight line.

6. The display panel of claim 1, wherein all of the spacers have a same height.

7. The display panel of claim 1, wherein a center width of each of the spacers between adjacent sub-pixel grooves is smaller than a minimum distance between adjacent sub-pixel grooves, and a distance between two opposite ends of each of the spacers is greater than the minimum distance between adjacent sub-pixel grooves.

8. A display device, comprising the display panel of claim 1.

* * * * *